United States Patent
Nakamura

(10) Patent No.: US 11,125,934 B2
(45) Date of Patent: Sep. 21, 2021

(54) OPTICAL MEMBER AND LIGHT GUIDE SYSTEM

(71) Applicant: NITTO DENKO CORPORATION, Ibaraki (JP)

(72) Inventor: Kozo Nakamura, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/772,459

(22) PCT Filed: Oct. 16, 2018

(86) PCT No.: PCT/JP2018/038408
§ 371 (c)(1),
(2) Date: Jun. 12, 2020

(87) PCT Pub. No.: WO2019/116715
PCT Pub. Date: Jun. 20, 2019

(65) Prior Publication Data
US 2021/0080642 A1    Mar. 18, 2021

(30) Foreign Application Priority Data
Dec. 14, 2017   (JP) .............................. JP2017-239327

(51) Int. Cl.
*F21V 8/00*    (2006.01)

(52) U.S. Cl.
CPC ......... *G02B 6/0088* (2013.01); *G02B 6/0051* (2013.01); *G02B 6/0053* (2013.01); *G02B 6/0055* (2013.01)

(58) Field of Classification Search
CPC .. G02B 6/0026; G02B 6/0051; G02B 6/0053; G02B 6/0055; G02B 6/0088
See application file for complete search history.

(56) References Cited

U.S. PATENT DOCUMENTS

| 7,731,410 B2 | 6/2010 | Chu |
| 10,001,594 B2 | 6/2018 | Hayashi |

(Continued)

FOREIGN PATENT DOCUMENTS

| JP | 2007-184262 A | 7/2007 |
| JP | 2013-258359 A | 12/2013 |

(Continued)

OTHER PUBLICATIONS

International Search Report dated Jan. 8, 2019, issued in counterpart International Application No. PCT/JP2018/038408 (2 pages).

*Primary Examiner* — Mary Ellen Bowman
(74) *Attorney, Agent, or Firm* — Westerman, Hattori, Daniels & Adrian, LLP

(57) ABSTRACT

There is provided an optical member and a light guide system each of which is capable of further thinning, and is achieved to emit light having high brightness and excellent in color reproducibility and uniformity. An optical member of the present invention includes: a light guide plate having a first main surface and a second main surface; a wavelength conversion layer, which is arranged near one end portion of the first main surface of the light guide plate, and is configured to convert a wavelength of light in an ultraviolet to blue region entering the wavelength conversion layer from an opposite side to the light guide plate, to thereby guide the light to the light guide plate; and a first reflective plate arranged on a side surface of the light guide plate on a side where the wavelength conversion layer is arranged.

12 Claims, 2 Drawing Sheets

(56) References Cited

U.S. PATENT DOCUMENTS

| | | | | |
|---|---|---|---|---|
| 2007/0154199 A1* | 7/2007 | Chu | ................. | G02B 6/0021 |
| | | | | 396/106 |
| 2008/0094853 A1* | 4/2008 | Kim | ................. | G02B 6/0068 |
| | | | | 362/612 |
| 2010/0008067 A1* | 1/2010 | Tai | ................. | G02B 6/0063 |
| | | | | 362/97.1 |
| 2012/0113675 A1* | 5/2012 | Yang | ................. | F21K 9/61 |
| | | | | 362/606 |
| 2015/0185393 A1* | 7/2015 | Bang | ................. | G02B 6/0023 |
| | | | | 362/608 |
| 2015/0219311 A1* | 8/2015 | Cho | ................. | G02B 5/0242 |
| | | | | 362/608 |
| 2015/0253482 A1* | 9/2015 | Seo | ................. | G02B 6/0026 |
| | | | | 362/608 |
| 2015/0285982 A1* | 10/2015 | Coe-Sullivan | ......... | G02B 6/005 |
| | | | | 362/330 |
| 2017/0090101 A1* | 3/2017 | Hayashi | ............... | G02B 6/0091 |

FOREIGN PATENT DOCUMENTS

| | | |
|---|---|---|
| JP | 2017-1250 A | 1/2017 |
| JP | 2017-24325 A | 2/2017 |
| JP | 2017-69049 A | 4/2017 |

\* cited by examiner

OPTICAL MEMBER AND LIGHT GUIDE SYSTEM

TECHNICAL FIELD

The present invention relates to an optical member and a light guide system.

BACKGROUND ART

In recent years, as an image display apparatus, a liquid crystal display apparatus has been enjoying remarkably widespread use. In recent years, there has been an increasing demand that the liquid crystal display apparatus be thinner and more flexible, and there has been a strong demand that each member to be incorporated into the liquid crystal display apparatus be also thinner and more flexible. One example of the member to be incorporated into the liquid crystal display apparatus is a backlight unit. Hitherto, for thinning of the backlight unit, its illumination system has been changed from a direct system to an edge light system. However, in the edge light system, it is difficult to further thin a light source (typically a LED lamp) from its current thickness. Further thinning of the light source may result in a problem of a reduction in brightness due to a reduction in light utilization efficiency, and further thinning of a member such as a light guide plate may result in a problem of a reduction in uniformity of light to be emitted from the member.

CITATION LIST

Patent Literature

[PTL 1] JP 2017-1250 A

SUMMARY OF INVENTION

Technical Problem

The present invention has been made in order to solve the conventional problems as described above, and an object of the present invention is to provide an optical member and a light guide system each of which is capable of further thinning, and is achieved to emit light having high brightness and excellent in color reproducibility and uniformity.

Solution to Problem

An optical member according to an embodiment of the present invention includes: a light guide plate having a first main surface and a second main surface; a wavelength conversion layer, which is arranged near one end portion of the first main surface of the light guide plate, and is configured to convert a wavelength of light in an ultraviolet to blue region entering the wavelength conversion layer from an opposite side to the light guide plate, to thereby guide the light to the light guide plate; and a first reflective plate arranged on a side surface of the light guide plate on a side where the wavelength conversion layer is arranged.

In one embodiment of the present, invention, the optical member further includes a second reflective plate arranged on the second main surface of the light guide plate.

In one embodiment of the present invention, the optical member further includes a light-diffusing layer in a part of the first main surface of the light guide plate, the part being free of the wavelength conversion layer.

In one embodiment of the present invention, the optical member further includes a first prism sheet on an opposite side of the light-diffusing layer to the light guide plate.

In one embodiment of the present invention, the optical member further includes a second prism sheet on an opposite side of the first prism sheet, to the light-diffusing layer.

In one embodiment of the present invention, the light guide plate has a thickness of 300 µm or less.

In one embodiment of the present invention, the optical member is bendable.

According to another aspect of the present invention, there is provided a light guide system. The light guide system includes: the optical member as described above; and a light source, which is arranged on an opposite side of the wavelength conversion layer of the optical member to the light guide plate, and is configured to emit light in an ultraviolet to blue region.

In one embodiment of the present invention, the light guide plate has a thickness of 300 µm or less, and the light source has a thickness of 200 µm or less.

In one embodiment of the present invention, the light guide system is bendable.

Advantageous Effects of Invention

According to the present invention, a configuration in which light is allowed to enter near the end portion of the light guide plate from a normal direction, and the incident light propagates through the inside of the light guide plate in a horizontal direction is adopted, and thus the optical member and the light guide system each of which is capable of further thinning, and is achieved to emit light having high brightness and excellent in color reproducibility and uniformity can be achieved.

DESCRIPTION OF EMBODIMENTS

A. Optical Member

A-1. Entire Configuration of Optical Member

Figure 1:
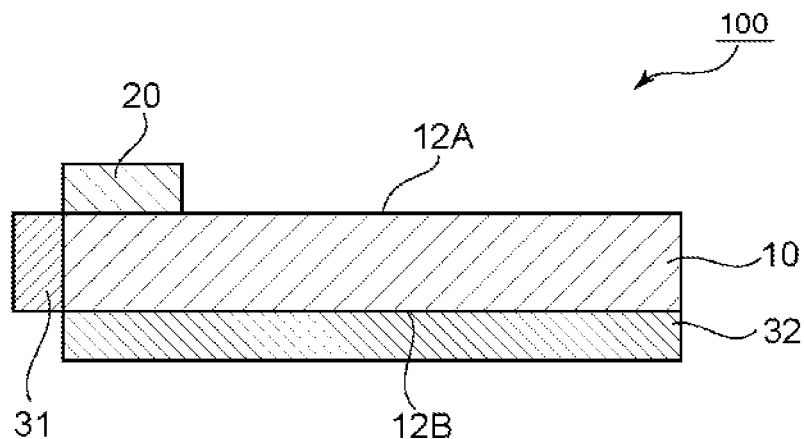
FIG. 1 is a schematic cross-sectional view for illustrating an optical member according to one embodiment of the present invention.

An optical member according to an embodiment of the present invention is described below with reference to the drawings. For ease of viewing, a ratio among longitudinal, lateral, and thickness dimensions in the drawings is different from an actual one.

Figure 2:
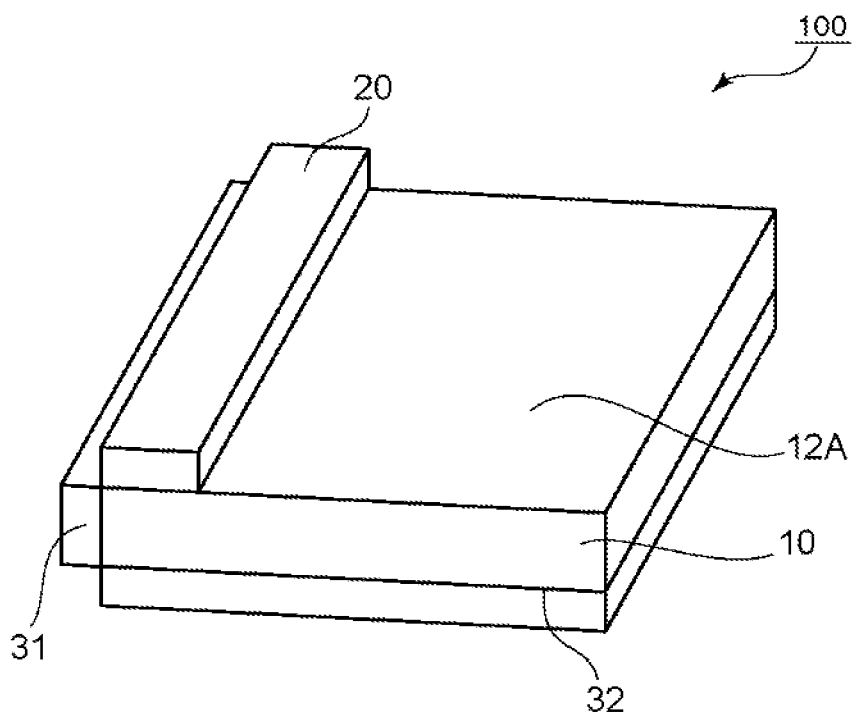
FIG. 2 is a schematic perspective view of the optical member of FIG. 1.

FIG. 1 is a schematic cross-sectional view for illustrating an optical member according to one embodiment of the present invention, and FIG. 2 is a schematic perspective view thereof. An optical member 100 of the illustrated example includes a light guide plate 10, a wavelength conversion layer 20, a first reflective plate 31, and a second reflective plate 32. The second reflective plate 32 may be omitted depending on purposes and the like. The light guide plate 10 has a first main surface 12A and a second main surface 12B. The wavelength conversion layer 20 is arranged near one (left side of the drawing sheet in the illustrated example) end portion of the first main surface 12A of the light guide plate 10. The wavelength conversion layer 20 is configured to convert the wavelength of light in an ultraviolet to blue region, which enters the wavelength conversion layer 20 from a light source (described later) on the opposite side to the light guide plate 10 (above in a normal direction in the illustrated example), to thereby guide the light to the light guide plate 10. The wavelength conversion layer 20 may typically convert incident light from the light source into white light. The half width of the light, which has its wavelength converted in the wavelength conversion layer and is guided to the light guide plate, is preferably less than 50 nm, more preferably less than 40 nm, still more preferably less than 30 nm. The lower limit of the half width may be, for example, 10 nm. When the half width falls within such ranges, excellent color reproducibility can be achieved. In the illustrated example, the wavelength conversion layer 20 is arranged so that its end portion maybe aligned (flush) with the end portion of the light guide plate, but the wavelength conversion layer 20 may be arranged so that its end portion may be at a predetermined distance inward from the end portion of the light guide plate. More specifically, the predetermined distance may vary depending on the size of the optical member. The predetermined distance may be, for example, from 0 cm (the end portion of the wavelength conversion layer and the end portion of the light guide plate are aligned as in FIG. 1) to 10 cm, and may be preferably from 0 cm to 5 cm.

The first reflective plate 31 is arranged on a side surface of the light guide plate 10 on a side where the wavelength conversion layer 20 is arranged (left side of the drawing sheet in the illustrated example). As described above, the second reflective plate 32 is an optional member to be provided depending on purposes. The second reflective plate 32 may be arranged on the second main surface 12B of the light guide plate 10. The second reflective plate 32 may be arranged over the entirety of the second main surface 12B of the light guide plate 10, or may be arranged on at least part of the second main surface 12B. The second reflective plate 32 is preferably arranged over the entirety of the second main surface 12B as in the illustrated example.

Figure 3:
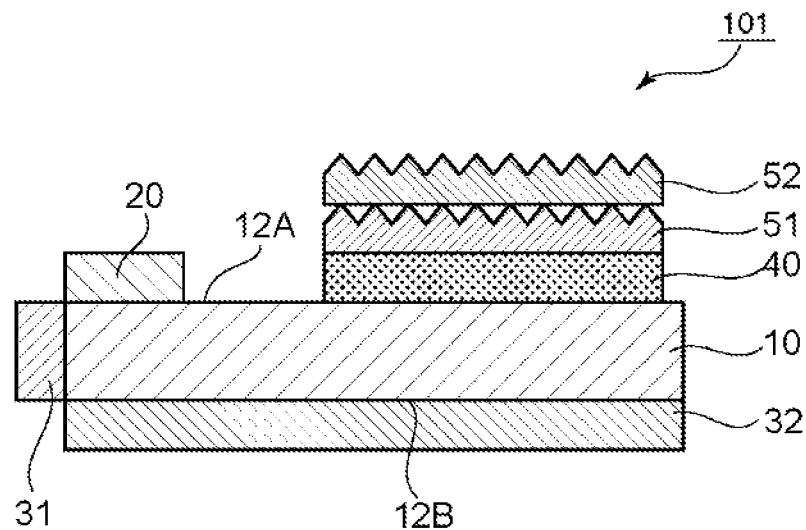
FIG. 3 is a schematic cross-sectional view for illustrating an optical member according to another embodiment of the present invention.

FIG. 3 is a schematic cross-sectional view for illustrating an optical member according to another embodiment of the present invention. An optical member 101 according to this embodiment further includes a light-diffusing layer 40 in a part of the first main surface 12A of the light guide plate 10, the part being free of the wavelength conversion layer 20. As in the illustrated example, the optical member 101 according to this embodiment may further include a first prism sheet 51 on the opposite side of the light-diffusing layer 40 to the light guide plate 10, and may further include a second prism sheet 52 on the opposite side of the first prism sheet 51 to the light-diffusing layer 40. The optical member 101 according to this embodiment may further include another light-diffusing layer (not shown) on the opposite side of the second prism sheet 52 to the first prism sheet 51.

The optical member according to the embodiment of the present invention is preferably bendable. The term "bendable" as used herein means that, when the optical member is bent with a radius of curvature of 20 mm, its optical function does not disappear due to cracking or breakage. In other words, the optical member according to the embodiment of the present invention is preferably bendable with a radius of curvature of 20 mm or less. The optical member is bendable with a radius of curvature of more preferably 15 mm or less, still more preferably 10 mm or less, particularly preferably 5 mm or less.

The constituent elements of the optical member may be laminated or fixed together via any appropriate adhesion layer (e.g., an adhesive layer or a pressure-sensitive adhesive layer: not shown) unless otherwise specified.

The above-mentioned embodiments may be appropriately combined, and modifications obvious in the art may be made to the constituent elements in the above-mentioned embodiments. Further, the constituent elements may each be replaced with an optically equivalent configuration.

Now, the light guide plate, the wavelength conversion layer, the reflective plates, the light-diffusing layer, and the prism sheets, which are included in the optical member according to the embodiment of the present invention, are described.

A-2. Light Guide Plate

The light guide plate 10 is a member configured as follows: light entering from the wavelength conversion layer 20 is guided in the light guide plate 10 in a horizontal direction while being subjected tea reflecting action or the like, and in the light-guiding process, is gradually emitted from a light-emitting surface (the first main surface 12A in the illustrated example). Any appropriate light guide plate may be used as the light guide plate. For example, a light guide plate having a lens pattern formed on the second main surface, or a light guide plate having prism shapes or the like formed on the first main surface and/or the second main surface is used. A light guide plate having prism shapes formed on the first main surface and the second main surface is preferably used. In the light guide plate, the edge line direction of each of the prism shapes formed on the second main surface, and that of each of the prism shapes formed on the first main surface are preferably perpendicular to each other. The details of a specific configuration of the light guide plate are described in, for example, JP 2013-190778 A, JP 2013-190779 A, and JP 2014-235397 A, the descriptions of which are incorporated herein by reference.

Any appropriate material maybe adopted as a constituent material for the light guide plate as long as the material has desired translucency and as long as the optical member to be obtained can be made bendable. Specific examples of the constituent material include a thermoplastic resin, a reactive resin (e.g., an ionizing radiation-curable resin), and glass. Examples of the thermoplastic resin include resins each containing, as a main component, one or more selected from an acrylic resin, such as polymethyl methacrylate (PMMA), a styrene resin, a polycarbonate (PC) resin, a polyethylene terephthalate (PET) resin, and acrylonitrile. An example of the reactive resin is an epoxy acrylate-based or urethane acrylate-based ionizing radiation-curable resin.

The light guide plate may be integrally formed by subjecting the constituent material to extrusion, or prism shapes or the like may be formed on the first main surface and/or second main surface of a sheet formed of the constituent material.

The thickness of the light guide plate may be preferably set so that the optical member to be obtained may be bendable. Specifically, the thickness of the light guide plate is typically 2,000 μm or less, preferably 300 μm or less, more preferably from 50 μm to 250 μm. According to the embodiment of the present invention, through the combination of the predetermined light guide plate, wavelength conversion layer, and reflective plate, the light source can be arranged at a predetermined position on the surface of the light guide plate. As a result, the thickness of the light source does not serve as a dominant factor in determining the total thickness of the optical member. Therefore, when the thickness of the light guide plate falls within the above-mentioned ranges (preferably 300 μm or less), further thinning of the optical member can be achieved, and preferably, the optical member can be made bendable.

A-3. Wavelength Conversion Layer

The wavelength conversion layer typically includes a matrix and a wavelength conversion material dispersed in the matrix.

A-3-1. Matrix

Any appropriate material may be used as a material for forming the matrix (hereinafter sometimes referred to as matrix material). Examples of such material induce a resin, an organic oxide, and an inorganic oxide. It is preferred that the matrix material have low oxygen permeability and low moisture permeability, have high light stability and high chemical stability, have a predetermined refractive index, have excellent transparency, and/or have excellent dispersibility of the wavelength conversion material. In practical use, the matrix maybe formed of a resin film or a pressure-sensitive adhesive.

A-3-1-1. Resin Film

When the matrix is the resin film, any appropriate resin may be used as a resin for forming the resin film. Specifically, the resin may be a thermoplastic resin, may be a thermosetting resin, or may be an active energy ray-curable resin. Examples of the active energy ray-curable resin include an electron beam-curable resin, a UV-curable resin, and a visible ray-curable resin. Specific examples of the resin include an epoxy, a (meth)acrylate (e.g., methyl methacrylate or butyl acrylate), norbornene, polyethylene, poly(vinyl butyral), poly(vinyl acetate), polyurea, polyurethane, amino silicone (AMS), polyphenylmethylsiloxane, polyphenylalkylsiloxane, polydiphenylsiloxane, polydialkylsiloxane, silsesquioxane, silicone fluoride, vinyl and hydrogenated product-substituted silicone, a styrene-based polymer (e.g., polystyrene, amino polystyrene (APS), or poly(acrylonitrile ethylene styrene) (AES)), a polymer cross-linked with a bifunctional monomer (e.g., divinylbenzene), a polyester-based polymer (e.g., polyethylene terephthalate), a cellulose-based polymer (e.g., triacetylcellulose), a vinyl chloride-based polymer, an amide-based polymer, an imide-based polymer, a vinyl alcohol-based polymer, an epoxy-based polymer, a silicone-based polymer, and an acrylic urethane-based polymer. Those resins may be used alone or in combination thereof (e.g., a blend or a copolymer). After any such resin has been formed into a film, the film may be subjected to treatment, such as stretching, heating, or pressurization. Of those, a thermosetting resin or a UV-curable resin is preferred, and a thermosetting resin is more preferred.

A-3-1-2. Pressure-Sensitive Adhesive

When the matrix is the pressure-sensitive adhesive, any appropriate pressure-sensitive adhesive may be used as the pressure-sensitive adhesive. The pressure-sensitive adhesive preferably has transparency and optical isotropy. Specific examples of the pressure-sensitive adhesive include a rubber-based pressure-sensitive adhesive, an acrylic pressure-sensitive adhesive, a silicone-based pressure-sensitive adhesive, an epoxy-based pressure-sensitive adhesive, and a cellulose-based pressure-sensitive adhesive. Of those, a rubber-based pressure-sensitive adhesive or an acrylic pressure-sensitive adhesive is preferred.

A-3-2. Wavelength Conversion Material

The wavelength conversion material is capable of controlling the wavelength conversion characteristic of the wavelength conversion layer. The wavelength conversion material may be, for example, quantum dots or a phosphor.

The content of the wavelength conversion material (when two or more kinds are used, the total content thereof) in the wavelength conversion layer is preferably from 0.01 part by weight to 50 parts by weight, more preferably from 0.01 part by weight to 30 parts by weight with respect to 100 parts by weight of the matrix material (typically a resin or pressure-sensitive adhesive solid content). When the content of the wavelength conversion material falls within such ranges, a liquid crystal display apparatus excellent in balance among all the RGB hues can be achieved.

A-3-2-1. Quantum Dots

The center emission wavelength of each of the quantum dots may be adjusted on the basis of, for example, the material and/or composition, particle size, and shape of each of the quantum dots.

The quantum dots may each be formed of any appropriate material. The quantum dots may each be formed of preferably an inorganic material, more preferably an inorganic conductor material or an inorganic semiconductor material. Examples of the semiconductor material include semiconductors of Groups II-VI, Groups III-V, Groups IV-VI, and Group IV. Specific examples thereof include Si, Ge, Sn, Se, Te, B, C (including diamond), P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2(S, Se, Te)_3$, and $Al_2CO$. Those materials may be used alone or in combination thereof. The quantum dots may each contain a p-type dopant or an n-type dopant. In addition, the quantum dots may each have a core-shell structure. In the core-shell structure, any appropriate functional layer (a single layer or a plurality of layers) may be formed on the periphery of a shell depending on purposes, or the surface of the shell may be subjected to surface treatment and/or chemical modification.

Any appropriate shape may be adopted as the shape of each of the quantum dots depending on purposes. Specific examples thereof include a true spherical shape, a flaky shape, a plate-like shape, an ellipsoidal shape, and an amorphous shape.

Any appropriate size may be adopted as the size of each of the quantum dots depending on a desired emission wavelength. The size of each of the quantum dots is preferably from 1 nm to 10 nm, more preferably from 2 nm to 8 nm. When the size of each of the quantum dots falls within such ranges, sharp emission is shown for each of green light and red light, and a high color rendering property can be achieved. For example, green light can be emitted when the quantum dots each have a size of about 7 nm, and red light can be emitted when the quantum dots each have a size of about 3 nm. When the quantum dots each have, for example, a true spherical shape, the size of each of the quantum dots is the average particle diameter, and when the quantum dots each have any other shape, the size is a dimension along the shortest axis in the shape.

The details of the quantum dots are described in, for example, JP 2012-169271 A, JP 2015-102857 A, JP 2015-65158 A, JP 2013-544018 A, and JP 2010-533976 A, the descriptions of which are incorporated herein by reference. Commercially available products may be used as the quantum dots.

A-3-2-2. Phosphor

Any appropriate phosphor capable of emitting light of a desired color depending on purposes may be used as the phosphor. Specific examples thereof include a red phosphor and a green phosphor.

An example of the red phosphor is a complex fluoride phosphor activated with $Mn^{4+}$. The complex fluoride phosphor refers to a coordination compound containing at least one coordination center (e.g., M to be described later) surrounded by fluoride ions acting as ligands, in which, as required, electric charge is compensated for by a counterion (e.g., A to be described later). Specific examples thereof include $A_2[MF_5]:Mn^{4+}$, $A_3[MF_6]:Mn^{4+}$, $Zn_2[MF_7]:Mn^{4+}$, $A[In_2F_7]:Mn^{4+}$, $A_2[M'F_6]:Mn^{4+}$, $E[M'F_6]:Mn^{4+}$, $A_3[ZrF_7]:Mn^{4+}$, and $Ba_{0.65}Zr_{0.35}F_{2.70}:Mn^{4+}$. In the formulae, A represents Li, Na, K, Rb, Cs, $NH_4$, or a combination thereof, M represents Al, Ga, In, or a combination thereof, M' represents Ge, Si, Sn, Ti, Zr, or a combination thereof, and E represents Kg, Ca, Sr, Ba, Zn, or a combination thereof. Of those, a complex fluoride phosphor having a coordination number at the coordination center of 6 is preferred. The details of such red phosphor are described in, for example, JP 2015-84327 A, the description of which is incorporated herein by reference in its entirety.

An example of the green phosphor is a compound containing, as a main component, a solid solution of SiAlON having a $\beta\text{-}Si_3N_4$ crystal structure. Treatment for adjusting the amount of oxygen contained in such SiAlON crystal to a specific amount (e.g., 0.8 mass %) or less is preferably performed. When such treatment is performed, a green phosphor capable of emitting sharp light with a small peak width can be obtained. The details of such green phosphor are described in, for example, JP 2013-28814 A, the description of which is incorporated herein by reference in its entirety.

The wavelength conversion layer may be a single layer, or may have a laminated structure. When the wavelength conversion layer has a laminated structure, respective layers may typically contain wavelength conversion materials having light emission characteristics different from each other.

The thickness of the wavelength conversion layer (when the wavelength conversion layer has a laminated structure, the total thickness thereof) is preferably from 1 µm to 500 µm, more preferably from 100 µm to 400 µm. When the thickness of the wavelength conversion layer falls within such ranges, the wavelength conversion layer can be excellent in conversion efficiency and durability. When the wavelength conversion layer has a laminated structure, the thickness of each of its layers is preferably from 1 µm to 300 µm, more preferably from 10 µm to 250 µm. When the thickness of the wavelength conversion layer falls within such ranges, a contribution can be made to further thinning of the optical member to be obtained, and preferably, the optical member can be made bendable.

The water vapor transmission rate (moisture vapor transmission rate) of the wavelength conversion layer in terms of a thickness of 50 µm is preferably 100 $g/m^2 \cdot day$ or less, more preferably 80 $g/m^2 \cdot day$ or less. The water vapor transmission rate may be measured under an atmosphere at 40° C. and 90% RH by a measurement method in conformity to JIS K 7129.

A-3-3. Barrier Function

Irrespective of whether the matrix is the resin film or the pressure-sensitive adhesive, the wavelength conversion layer preferably has a barrier function against oxygen and/or water vapor. The phrase "has a barrier function" as used herein means controlling the transmission amount of oxygen and/or water vapor penetrating into the wavelength conversion layer to substantially shield the wavelength conversion material therefrom. The wavelength conversion layer may express the barrier function by imparting, to the wavelength conversion material itself, a three-dimensional structure, such as a core-shell structure or a tetrapod-like structure, in addition, the wavelength conversion layer may express the barrier function through appropriate selection of the matrix material.

A-3-4. Others

The wavelength conversion layer may further contain any appropriate additive depending on purposes. Examples of the additive include a light-diffusing material, a material for imparting anisotropy to light, and a material for polarizing light. Specific examples of the light-diffusing material include fine particles each formed of an acrylic resin, a silicone-based resin, a styrene-based resin, or a resin based on a copolymer thereof. Specific examples of the material for imparting anisotropy to light and/or the material for polarizing light include: ellipsoidal fine particles in each of which birefringence on its major axis differs from that on its minor axis; core-shell type fine particles; and laminated fine particles. The kind, number, blending amount, and the like of the additives may be appropriately set depending on purposes.

The wavelength conversion layer may be formed by, for example, applying a liquid composition containing the matrix material and the wavelength conversion material, and as required, the additive. For example, when the matrix material is a resin, the wavelength conversion layer may be formed by applying a liquid composition containing the matrix material and the wavelength conversion material, and as required, the additive, a solvent, and a polymerization initiator to any appropriate support, and then drying and/or curing the liquid composition. The solvent and the polymerization initiator may be appropriately set depending on the kind of the matrix material (resin) to be used. Any appropriate application method may be used as an application method. Specific examples thereof include a curtain coating method, a dip coating method, a spin coating method, a print coating method, a spray coating method, a slot coating method, a roll coating method, a slide coating method, a blade coating method, a gravure coating method, and a wire bar method. Curing conditions may be appropriately set depending on, for example, the kind of the matrix material (resin) to be used and the composition of the composition, when the wavelength conversion material is added to the matrix material, the wavelength conversion material may be added in a state of particles, or may be added in a state of a dispersion liquid by being dispersed in a solvent. The wavelength conversion layer may be formed on a barrier layer.

The wavelength conversion layer formed on the support may be transferred to another constituent element of the optical member (typically a light guide plate).

A-4. Reflective Plate

The first reflective plate 31 and the second reflective plate 32 are described together except when needing separate descriptions, because similar descriptions are applicable. The first reflective plate and the second reflective plate are hereinafter collectively referred to simply as "reflective plate" except when needing to be distinguished.

Any appropriate configuration may be adopted for the reflective plate. For example, the reflective plate maybe a specular reflection plate, or may be a diffuse reflection plate. Specific examples of the reflective plate include: a resin sheet having a high reflectance (e.g., an acrylic plate); a metal thin plate or metal foil of aluminum, stainless steel, or the like; a deposited sheet obtained by depositing aluminum, silver, or the like from the vapor onto a substrate, such as a resin film of polyester or the like; a laminate of a substrate, such as a resin film of polyester or the like, and a metal foil of aluminum or the like; and a resin film having a void formed therein.

The reflectance of the reflective plate is preferably 90% or more, more preferably 92% or more, still more preferably 95% or more.

The thickness of the reflective plate (in particular, the second reflective plate) may be preferably set so that the optical member to be obtained may be bendable. Specifically, the thickness of the second reflective plate is preferably 100 μm or less, more preferably from 30 μm to 70 μm. According to the embodiment of the present invention, through the combination of the predetermined light guide plate, wavelength conversion layer, and reflective plate, the light source can be arranged at a predetermined position on the surface of the light guide plate. As a result, the thickness of the light source does not serve as a dominant factor in determining the total thickness of the optical member. Therefore, when the thickness of the second reflective plate falls within the above-mentioned ranges, further thinning of the optical member can be achieved, and preferably, the optical member can be made bendable. The thickness of the first reflective plate is a thickness in a direction (specifically a horizontal direction, i.e., the right and left direction of the drawing sheet) perpendicular to its surface having a reflecting function. Therefore, the thickness of the first reflective plate does not substantially serve as an important factor for the thinning of the optical member. The thickness of the first reflective plate may be similar to the thickness of the second reflective plate.

A-5. Light-Diffusing Layer

Any appropriate configuration may be adopted for the light-diffusing layer 40. Specifically, the light-diffusing layer may be a diffuser having a fine uneven structure on its surface, may be a light-diffusing element including a matrix and light-diffusible fine particles dispersed in the matrix, or may be a light-diffusing pressure-sensitive adhesive whose matrix is formed of a pressure-sensitive adhesive.

The light-diffusing performance of the light-diffusing layer may be represented by, for example, a haze value and/or a light-diffusing half-value angle. The haze value of the light-diffusing layer is preferably from 50% to 95%, more preferably from 60% to 95%, still more preferably from 70% to 95%. When the haze value is set to fall within the above-mentioned ranges, desired diffusing performance is obtained, and the occurrence of moire can be satisfactorily suppressed. The light-diffusing half-value angle of the light-diffusing layer is preferably from 5° to 50°, more preferably from 10° to 30°. The light-diffusing performance of the light-diffusing layer may be controlled by adjusting, for example, the fine uneven structure of its surface, a constituent material for the matrix (the pressure-sensitive adhesive in the case of the light-diffusing pressure-sensitive adhesive), and a constituent material for, and the volume-average particle diameter and blending amount of, the light-diffusible fine particles.

The total light transmittance of the light-diffusing layer is preferably 75% or more, more preferably 80% or more, still more preferably 85% or more.

The thickness of the light-diffusing layer may be appropriately adjusted depending on, for example, its configuration and diffusing performance, and the bending property of the optical member to be obtained. The thickness of the light-diffusing layer is preferably from 5 μm to 200 μm.

The details of the light-diffusing element and the light-diffusing pressure-sensitive adhesive are described in, for example, JP 2012-83741 A, JP 2012-83742 A, JP 2012-63743 A, JP 2012-83744 A, JP 2013-235259 A, and JP 2014-224964 A, the descriptions of which are incorporated herein by reference. An uneven surface-type diffuser is well-known in the art.

A-6. Prism Sheet

The first prism sheet 51 and the second prism sheet 52 are described together except when needing separate descriptions, because similar descriptions are applicable. The first prism sheet and the second prism sheet are hereinafter collectively referred to simply as "prism sheet" except when needing to be distinguished.

The prism sheet typically includes a substrate portion and a prism portion. When the optical member of the present invention is arranged on the backlight side of a liquid crystal display apparatus, the prism sheet guides light, which has been emitted from the light guide plate 10, as light having the maximum intensity in an approximately normal direction of the liquid crystal display apparatus to a polarizing plate by means of, for example, total reflection in the prism portion. The substrate portion may be omit ted depending on purposes and the configuration of the prism sheet. For example, when a layer adjacent to the substrate portion side of the prism sheet can function as a supporting member, the substrate portion may be omitted.

The thickness of the prism sheet is preferably from 50 μm to 200 μm. The thickness of the first prism sheet and the thickness of the second prism sheet may be identical to or different from each other, when the thickness of the prism sheet falls within such ranges, a contribution can be made to further thinning of the optical member to be obtained, and preferably, the optical member can be made bendable.

A-6-1. Prism Portion

The prism sheet (substantially the prism portion) typically includes an array of a plurality of columnar unit prisms, which are convex toward the opposite side to the substrate portion. It is preferred that each of the unit prisms be columnar, and be configured such that its lengthwise direction (edge line direction) is a direction approximately perpendicular, or a direction approximately parallel, to the transmission axis of a polarizing plate in a liquid crystal display apparatus, in the illustrated example, the prism sheet is arranged so that the unit prisms are on the opposite side to the light-diffusing layer 40, but the prism sheet may be arranged so that the unit prisms are on the light-diffusing layer 40 side.

Any appropriate configuration may be adopted for the shape of each of the unit prisms as long as the effects of the present invention are obtained. The shape of a section of each of the unit prisms parallel to its array direction and parallel to its thickness direction may be a triangular shape, or may be any other shape (e.g., such a shape that one or both of the inclined planes of a triangle have a plurality of flat surfaces having different tilt angles). The triangular shape may be a shape asymmetric with respect to a straight line passing the apex of the unit prism and perpendicular to the surface of the sheet (e.g., a scalene triangle), or may be a shape symmetric with respect to the straight line (e.g., an isosceles triangle). Further, the apex of the unit prism may have a chamfered curved surface shape, or may have a shape whose section is a trapezoid, the shape being obtained by such cutting that its tip becomes a flat surface. Detailed shapes of the unit prisms maybe appropriately set depending on purposes. For example, a configuration described in JP H11-84111 A may be adopted for each of the unit prisms.

All the unit prisms may have the same height, or the unit prisms may have different heights, when the unit prisms have different heights, in one embodiment, the unit prisms have two heights. For example, a unit prism having the larger height and a unit prism having the smaller height may be alternately arranged, a unit prism having the larger (or smaller) height may be arranged for, for example, every three, four, or five unit prisms, the unit prisms may be irregularly arranged depending on purposes, or the unit prisms may be completely randomly arranged. In another embodiment, the unit prisms have three or more heights.

A-6-2. Substrate Portion

When the substrate portion is arranged in the prism sheet, the substrate portion and the prism portion may be integrally formed by, for example, subjecting a single material to extrusion, or the prism portion may be shaped on a film for the substrate portion. The thickness of the substrate portion is preferably from 25 μm to 150 μm. With such thickness, the handling property and strength of the prism sheet can be excellent.

Any appropriate material may be adopted as a material for forming the substrate portion depending on purposes and the configuration of the prism sheet. When the prism portion is shaped on the film for the substrate portion, a specific example of the film for the substrate portion is a film formed of cellulose triacetate (TAC), a (meth)acrylic resin, such as polymethyl methacrylate (PMMA), or a polycarbonate (PC) resin. The film is preferably an unstretched film.

When the substrate portion and the prism portion are integrally formed of a single material, the same material as a material for forming the prism portion when the prism portion is shaped on the film for the substrate portion may be used as the material. Examples of the material for forming the prism portion include epoxy acrylate-based and urethane acrylate-based reactive resins (e.g., an ionizing radiation-curable resin). When the prism sheet of an integral configuration is formed, an optically transparent thermoplastic resin may be used. The examples of the resin include PC, a polyester resin such as PET, an acrylic resin such as PMMA or MS, and cyclic polyolefin.

The substrate portion preferably substantially has optical isotropy. The phrase "substantially has optical isotropy" as used herein means that a retardation value is so small as to have substantially no influences on the optical characteristics of a liquid crystal display apparatus. For example, the in-plane retardation Re of the substrate portion is preferably 20 nm or less, more preferably 10 nm or less. The in-plane retardation Re is an in-plane retardation value measured with light having a wavelength of 590 nm at 23° C. The in-plane retardation Re is expressed by Re=(nx−ny)×d. In the equation, nx represents a refractive index in a direction in which a refractive index becomes maximum in the plane of the optical member (i.e., a slow axis direction), ny represents a refractive index in a direction perpendicular to the slow axis in the plane (i.e., a fast axis direction), and "d" represents the thickness (nm) of the substrate portion.

Further, the photoelastic coefficient of the substrate portion is preferably from $-10\times10^{-12}$ $m^2/N$ to $10\times10^{-12}$ $m^2/N$, more preferably from $-5\times10^{-12}$ $m^2/N$ to $5\times10^{-12}$ $m^2/N$, still more preferably from $-3\times10^{-12}$ $m^2/N$ to $3\times10^{-12}$ $m^2/N$.

B. Light Guide System

Figure 4:
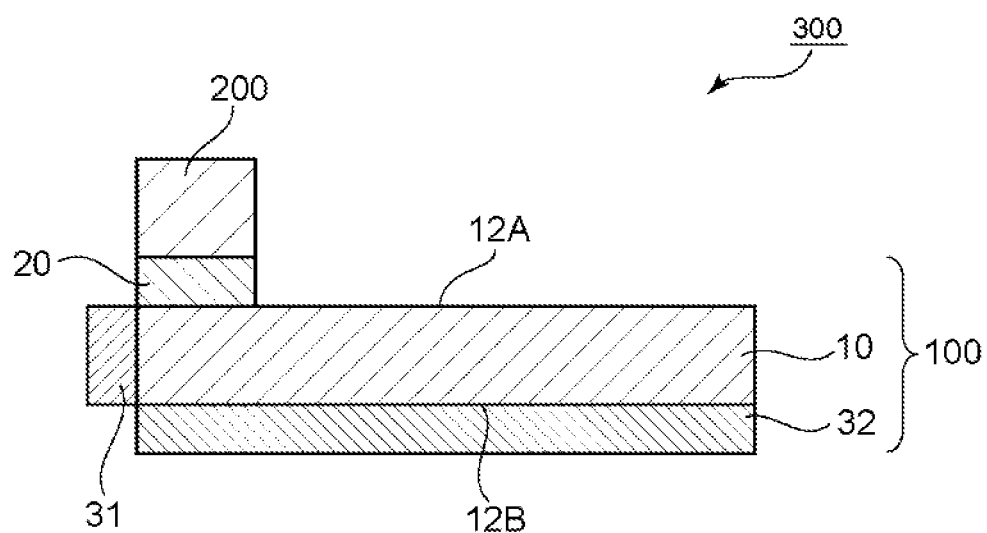
FIG. 4 is a schematic cross-sectional view for illustrating a light guide system according to one embodiment of the present invention.

According to another aspect of the present invention, there is provided a light guide system. FIG. 4 is a schematic cross-sectional view for illustrating a light guide system according to one embodiment of the present invention. A light guide system 300 of the illustrated example includes: the optical member described in the section A (in the illustrated example, the optical member 100 illustrated in FIG. 1); and a light source 200 arranged on the opposite side of the wavelength conversion layer 20 of the optical member to the light guide plate 10, and configured to emit light in an ultraviolet to blue region.

The details of the optical member are as described in the section A.

As described above, the light source 200 is configured to emit light in an ultraviolet to blue region. The light source may typically include a LED lamp. As described above, according to the embodiment of the present invention, through the combination of the predetermined light guide plate, wavelength conversion layer, and reflective plate, the light source can be arranged at a predetermined position on the surface of the light guide plate. As a result, the thickness of the light source does not serve as a dominant factor in determining the total thickness of the optical member. Therefore, when the thickness of the light guide plate falls within the above-mentioned ranges, further thinning of the optical member can be achieved, and preferably, the optical member can be made bendable. Further, through the combined use of the light source configured to emit light in an ultraviolet to blue region and the wavelength conversion layer, emitted light excellent in color reproducibility and uniformity can be achieved.

The thickness of the light source is preferably 200 μm or less, more preferably 150 μm or less, still more preferably 100 μm or less. A practical lower limit of the thickness of the light source is, for example, 50 μm. As described above, through the combination of the predetermined light guide plate, wavelength conversion layer, and reflective plate, there can be achieved a configuration in which light is allowed to enter near the end portion of the light guide plate from a normal direction, and the incident light propagates through the inside of the light guide plate in a horizontal direction. As a result, the light source can be arranged not at the end portion of the light guide plate, but at a predetermined position on the surface of the light guide plate (above the light guide plate). With this, a constraint on the mounting of the light source is eliminated, and the thickness of the light source can be made extremely small as described above. Therefore, the light guide system according to the embodiment of the present invention is capable of further thinning, and a bendable light guide system can be achieved by setting the light guide plate or the like to a predetermined thickness (e.g., by setting the thickness of the light guide plate to 300 μm or less).

The total thickness of the light guide system according to the embodiment of the present invention is preferably 800 μm or less, more preferably from 300 μm to 600 μm. The "total thickness" of the light guide system refers to the total sum of the thicknesses of the light guide plate, the wavelength conversion layer, the second reflective plate (if present), and the light source.

EXAMPLES

The present invention is specifically described below by way of Examples, but the present invention is not limited to these Examples.

Example 1

(Light Guide Plate and Wavelength Conversion Layer)

A commercially available television (manufactured by Samsung, product name: "UN65JS9000FXZA") was dismantled, and a light guide plate and a wavelength conversion sheet were taken out from its backlight member. The taken-out plate and sheet were used as a light guide plate and a wavelength conversion layer, respectively. The thickness of the light guide plate was 2,000 μm, and the thickness of the wavelength conversion layer was 300 μm.

(Reflective Plate)

A commercially available reflective plate (manufactured by Nakai Industrial Co., Ltd., product name: "KIRARA-FLEX") was used as each of a first reflective plate and a second reflective plate. The thickness of the reflective plate was 50 μm.

(Light-Diffusing Layers and Prism Sheets)

A commercially available tablet terminal (manufactured by Apple Inc., product name: "iPad 2") was dismantled, and diffusing layers and prism sheets included on its backlight side (four in total, i.e., an upper diffusing layer, an upper prism sheet, a lower prism sheet, and a lower diffusing layer in order from a viewer side) were taken out. The taken-out layers and sheets were used as light-diffusing layers and prism sheets in the same arrangement as in the tablet terminal. The thickness of the upper light-di f fusing layer was 80 μm, the thickness of the upper prism sheet was 150 μm, the thickness of the lower prism sheet was 90 μm, and the thickness of the lower light-diffusing layer was 60 μm.

(Light Source)

Blue LED Tape 12 V (manufactured by Bu Bu Market GK) was used. The thickness of the tape was 100 μm.

(Production of Optical Member and Light Guide System)

The wavelength conversion layer was bonded to an end portion of one surface of the light guide plate. Further, the second reflective plate was bonded to the entirety of the other surface of the light guide plate, and the first reflective plate was bonded to the side surface of the light guide plate on the side where the wavelength conversion layer was arranged. Then, in that part of the one surface of the light guide plate where the wavelength conversion layer was not arranged, the above-mentioned light-diffusing layer, prism sheet, prism sheet, and light-diffusing layer were laminated in the stated order. Thus, an optical member further including the light-diffusing layers above the prism sheets of the optical member illustrated in FIG. 3 was produced. Further, the light source was arranged above the wavelength conversion layer to produce a light guide system. The resultant light guide system was subjected to evaluations (1) and (2) described below. The results are shown in Table 1.

Example 2

An optical member and a light guide system were produced in the same manner as in Example 1 except that the second reflective plate was not arranged. The resultant light guide system was subjected to the same evaluations as those of Example 1. The results are shown in Table 1.

Comparative Example 1

An optical member and a light guide system were produced in the same manner as in Example 1 except that: the first reflective plate was not arranged; and the second reflective plate was not arranged. The resultant light guide system was subjected to the same evaluations as those of Example 1. The results are shown in Table 1.

Comparative Example 2

An optical member and a light guide system were produced in the same manner as in Example 1 except that: the wavelength conversion layer was not arranged; the first reflective plate was not arranged; and the second reflective plate was arranged only in a part corresponding to the part in which the light-diffusing layers and the prism sheets were laminated. The resultant light guide system was subjected to the same evaluations as those of Example 1. The results are shown in Table 1.

(1) Brightness

A conoscope (manufactured by Autronic-Melchers GmbH) was placed above the light-diffusing layer portion of each of the light guide systems obtained in Examples and Comparative Examples at a predetermined distance, the light source was driven at 12 V and 90 mA, and then brightness (unit: Lx) was measured every 1° in all directions. The result of the light guide system of Comparative Example 2 was used as a reference (reference value: 100), and the brightness was determined as a ratio to the reference value.

(2) Uniformity of Emitted Light

The light source of each of the light guide systems obtained in Examples and Comparative Examples was driven at 12 V and 90 mA, and then uniformity was visually observed from above (front direction) and evaluated by the following criteria.

○: uniform light was emitted over the entire surface of the light guide plate (except the wavelength conversion layer portion).

x: There was a portion in which light was not appropriately guided, and the emitted light had a nonuniform portion.

(3) Color of Emitted Light

The light source of each of the light guide systems obtained in Examples and Comparative Examples was driven at 12 V and 90 mA, and then the color of the emitted light was visually observed from above (front direction) and evaluated by the following criteria.

○: The color of the light source was appropriately converted into a desired color.

x: The color of the light source was in a nearly unchanged state.

TABLE 1

|  | Brightness | Uniformity | Color of emitted light |
| --- | --- | --- | --- |
| Example 1 | 168 | ○ | ○ |
| Example 2 | 145 | ○ | ○ |
| Comparative Example 1 | 113 | x | ○ |
| Comparative Example 2 | 100 | x | x |

<Evaluation>

As is apparent from Table 1, according to each of Examples of the present invention, a light guide system that has remarkably high brightness as compared to each of Comparative Examples can be achieved. Further, the light guide systems of Examples are found to be also excellent in uniformity and color of the emitted light. In addition, the above-mentioned excellent characteristics can be maintained even when the thickness of the light guide plate is reduced, and hence it has been confirmed that the light guide systems of Examples can be configured to be bendable.

INDUSTRIAL APPLICABILITY

The optical member and the light guide system of the present invention can each be suitably used for a liquid crystal display apparatus. The liquid crystal display apparatus using such optical member can be used for various applications, such as portable devices including a personal digital assistant (PDA), a cellular phone, a watch, a digital camera, and a portable gaming machine, OA devices including a personal computer monitor, a notebook-type personal computer, and a copying machine, electric home appliances including a video camera, a liquid crystal television set, and a microwave oven, on-board devices including a reverse monitor, a monitor for a car navigation system, and a car audio, exhibition devices including an information monitor for a commercial store, security devices including a surveillance monitor, and caring/medical devices including a caring monitor and a medical monitor.

REFERENCE SIGNS LIST 10 light guide plate
20 wavelength conversion layer
31 first reflective plate
32 second reflective plate
100 optical member
101 optical member
200 light source
300 light guide system

The invention claimed is:

1. An optical member, comprising:
    a light guide plate having a first main surface, a second main surface, and two side surfaces arranged perpendicular to the first main surface and the second main surface;
    a wavelength conversion layer, which is arranged near one end portion of the first main surface of the light guide plate, and is configured to convert a wavelength of light in an ultraviolet to blue region entering the wavelength conversion layer from an opposite side to the light guide plate, to thereby guide the light to the light guide plate; and
    a first reflective plate arranged only on one of the side surfaces of the light guide plate on a side near the one end portion where the wavelength conversion layer is arranged.

2. The optical member according to claim 1, further comprising a second reflective plate arranged on the second main surface of the light guide plate.

3. The optical member according to claim 1, further comprising a light-diffusing layer in a part of the first main surface of the light guide plate, the part being free of the wavelength conversion layer.

4. The optical member according to claim 3, further comprising a first prism sheet on an opposite side of the light-diffusing layer to the light guide plate.

5. The optical member according to claim 4, further comprising a second prism sheet on an opposite side of the first prism sheet to the light-diffusing layer.

6. The optical member according to claim 1, wherein the light guide plate has a thickness of 300 μm or less.

7. The optical member according to claim 6, wherein the optical member is bendable.

8. A light guide system, comprising:
    the optical member of claim 1; and
    a light source, which is arranged on an opposite side of the wavelength conversion layer of the optical member to the light guide plate, and is configured to emit light in an ultraviolet to blue region.

9. The light guide system according to claim 8, wherein the light guide plate has a thickness of 300 μm or less, and the light source has a thickness of 200 μm or less.

10. The light guide system according to claim 9, wherein the light guide system is bendable.

11. An optical member, comprising:
    a light guide plate having a first main surface, a second main surface, and two side surfaces arranged perpendicular to the first main surface and the second main surface;
    a wavelength conversion layer, which is arranged near one end portion of the first main surface of the light guide plate, and is configured to convert a wavelength of light in an ultraviolet to blue region entering the wavelength conversion layer from an opposite side to the light guide plate, to thereby guide the light to the light guide plate;
    a first reflective plate arranged only on one of the side surfaces of the light guide plate on a side near the one end portion where the wavelength conversion layer is arranged;
    a second reflective plate arranged on the second main surface of the light guide plate;
    a light-diffusing layer arranged in a part of the first main surface of the light guide plate, the part being free of the wavelength conversion layer;
    a first prism sheet arranged on an opposite side of the light-diffusing layer to the light guide plate; and
    a second prism sheet arranged on an opposite side of the first prism sheet to the light-diffusing layer.

12. The optical member according to claim 11, wherein the optical member is bendable.

* * * * *